United States Patent
Williams

(10) Patent No.: US 6,458,216 B1
(45) Date of Patent: *Oct. 1, 2002

(54) RETICLE CLEANING WITHOUT DAMAGING PELLICLE

(75) Inventor: Matthew E. Williams, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/543,036

(22) Filed: Apr. 5, 2000

Related U.S. Application Data

(63) Continuation of application No. 09/310,520, filed on May 12, 1999, now Pat. No. 6,063,208, which is a continuation of application No. 08/921,656, filed on Aug. 28, 1997, now Pat. No. 5,938,860.

(51) Int. Cl.[7] .............................. B08B 7/04; B08B 3/02; B08B 3/04
(52) U.S. Cl. ........................... 134/34; 134/33; 134/153; 134/200; 134/902
(58) Field of Search ........................... 134/34, 42, 200, 134/2, 902, 33, 153, 1.3, 1

(56) References Cited

U.S. PATENT DOCUMENTS

| | | |
|---|---|---|
| 4,624,557 A | 11/1986 | Winn |
| 4,715,392 A | 12/1987 | Abe et al. |
| 4,776,462 A | 10/1988 | Kosugi et al. |
| 4,898,058 A | 2/1990 | Seifert |
| 5,025,924 A | 6/1991 | Watanabe |
| 5,305,878 A | 4/1994 | Yen |
| 5,314,068 A | 5/1994 | Nakazato et al. |
| 5,330,053 A | 7/1994 | Tabuchi et al. |
| 5,397,665 A | 3/1995 | Tabuchi et al. |
| 5,634,230 A | 6/1997 | Maurer |
| 5,669,979 A | 9/1997 | Elliott et al. |
| 5,743,409 A | 4/1998 | Nakahara et al. |
| 5,814,156 A | 9/1998 | Elliott et al. |
| 5,820,950 A | 10/1998 | Wang |
| 5,888,327 A | 3/1999 | Akagawa et al. |
| 5,938,860 A | 8/1999 | Williams |
| 6,063,208 A * | 5/2000 | Williams .................. 134/2 |

* cited by examiner

*Primary Examiner*—Alexander Markoff
(74) *Attorney, Agent, or Firm*—Traskbritt

(57) ABSTRACT

A reticle having a pellicle frame and pellicle membrane is cleaned without removing or damaging the pellicle membrane. A cover encases the pellicle membrane and pellicle frame, sealing the pellicle from the external environment during a cleaning process. The cover fits around the periphery of the pellicle frame and covers the pellicle membrane. An edge of the cover in contact with the reticle forms a seal. The reticle is fastened to reticle supports on a spin chuck during the cleaning process. An anchor plate presses the cover to the reticle, maintaining the pellicle sealed from the external environment. The cover and reticle are sandwiched together between the anchor plate and spin chuck.

24 Claims, 4 Drawing Sheets

RETICLE CLEANING WITHOUT DAMAGING PELLICLE

CROSS REFERENCE TO RELATED APPLICATIONS

This application is a continuation of application Ser. No. 09/310,520, filed May 12, 1999, now U.S. Pat. No. 6,063,208, issued May 16, 2000, which is a continuation of application Ser. No. 08/921,656, filed Aug. 28, 1997, now U.S. Pat. No. 5,938,860, issued Aug. 17, 1999.

BACKGROUND OF THE INVENTION

This invention relates to integrated circuit fabrication tools and processes and, more particularly, to a method and apparatus for cleaning a pellicled reticle.

Integrated circuits (IC) commonly are fabricated on a semiconductor wafer. The semiconductor wafer typically is subjected to doping, deposition, etching, planarizing and lithographic processes to form semiconductor devices in the wafer. The wafer typically is cut to form multiple semiconductor "IC chips". Each chip includes many semiconductor devices. Although the label semiconductor is used, the devices are fabricated from various materials, including electrical conductors (e.g., aluminum, tungsten), electrical semiconductors (e.g., silicon) and electrical non-conductors (e.g., silicon dioxide).

A reticle is used in a lithographic process to define a photomask. A lithographic process refers to a process in which a pattern is delineated in a layer of material (e.g., photoresist) sensitive to photons, electrons or ions. The principle is similar to that of a photocamera in which an object is imaged on a photo-sensitive emulsion film. While with a photo-camera the "final product" is the printed image, the image in the semiconductor process context typically is an intermediate pattern which defines regions where material is deposited or removed. The lithographic process typically involves multiple exposing and developing steps, wherein at a given step the photoresist is exposed to photons, electrons or ions, then developed to remove one of either the exposed or unexposed portions of photoresist. Complex patterns typically require multiple exposure and development steps.

A typical lithographic system includes a light source, optical system and transparent photomask. The light source emits light through the optical system and photomask onto a photoresist layer of a semiconductor wafer. The photomask defines the "intermediate pattern" used for determining where photoresist is to be removed or left in place. Conventional photomasks are transparent masks. A photomask typically is formed on a glass blank. The mask and blank together are referred to as a reticle. Conventional materials for the blank include soda lime, borosilicate glass or fused silica. The photomask is formed by a film of opaque material. Typically, the film is formed with chrome less than 100 nm thick and covered with an anti-reflective coating such as chrome oxide. The purpose of the anti-reflective coating is to suppress ghost images from the light reflected by the opaque material.

The photomask serves to define geometries for materials deposited or etched on the wafer or materials applied to the wafer. The patterned film on the reticle blank includes mask lines and line spacings of less than 10 microns. Depending on the reduction factor x, line width and line space geometries for a resulting semiconductor device are from less than 10 microns to less than 2 microns. Other mask line spacings and semiconductor line spacings also can be achieved. When working with such small geometries, it is important that the reticle and other components in the fabrication processes be free of foreign particles. A tiny speck of dust alters the desired pattern to be imaged onto the wafer. Conventionally, a thin transparent membrane, referred to as a pellicle membrane, is applied over the photomask portion of the reticle to keep the photomask portion free of foreign particles. The pellicle membrane typically is positioned at a height above the photomask. Such height is greater than the focal length of the light imaged onto the photomask. Thus, small particles on the pellicle membrane will not block light from reaching the photomask.

Another problem caused by foreign particles is bad registration of the reticle. During a lithographic process, the reticle rests on a reticle table. The reticle table typically is part of a stepper device which also includes a light source and a stepper control. The stepper control manages the relative position of the light source and the reticle table. Even the smallest of particles on the edge of the reticle can lift a portion of the reticle off the reticle table. Such offset of the reticle can result in bad registration of the light onto the wafer, which in turn can result in bad overlay from one pattern to another. Because the pellicle membrane typically is very fragile, the pellicle membrane is destroyed during the course of cleaning the reticle. Conventionally, the pellicle membrane is removed, the entire surface of the reticle is cleaned, and then the reticle undergoes requalification. Such a process is very time consuming and costly. Accordingly, there is a need for an alternative method and apparatus for cleaning a reticle.

SUMMARY OF THE INVENTION

According to the invention, a reticle having a pellicle is cleaned without removing or damaging the pellicle. The pellicle includes a pellicle membrane and a pellicle frame. A cover encases the pellicle, sealing it from the external environment during the cleaning process.

According to one aspect of the invention, the cover fits around the periphery of the pellicle frame and covers the pellicle membrane. An edge of the cover in contact with the reticle (adjacent the pellicle frame) forms a seal. In a preferred embodiment, the edge includes a groove within which is an O-ring seal.

According to another aspect of the invention, the reticle is fastened to reticle supports on a spin chuck during the cleaning process. An anchor plate presses the cover to the reticle, maintaining the pellicle sealed from the external environment. The anchor plate fastens to the spin chuck. Thus, the cover and reticle are sandwiched together between the anchor plate and spin chuck.

According to another aspect of the invention, a system for cleaning a reticle having a pellicle frame and pellicle membrane is provided. The reticle has a pattern formed on a first surface, the pattern occurring within a first area of the first surface. The pellicle frame is attached to the first surface, defining a border of the pattern. The pellicle membrane is attached to the pellicle frame and elevated above the pattern, the pellicle membrane sealing the first area. The reticle is secured to a support. A lid encases the pellicle frame and pellicle membrane. The lid has a first surface in contact with the first surface of the reticle. A clamp pushes the lid to the reticle.

According to another aspect of the invention, the lid has a first surface in contact with the first surface of the reticle. The lid has a groove formed within the lid's first surface. An O-ring seal is within the groove. The O-ring seal is pressed into contact with the reticle by the lid under a force of the clamp. The clamp is secured to the support.

According to another aspect of the invention, a fluid under pressure is ejected onto the reticle, wherein the pellicle membrane is shielded from the fluid by the lid. A drive mechanism rotates the support, altering a portion of the reticle receiving the fluid under pressure.

According to another aspect of the invention, the lid and reticle serve as an apparatus for encasing the pellicle. The lid has a recessed area which is bordered peripherally by a first wall. The first wall is adjacent to a first edge. The first edge has a seal extending around a peripheral border of the recessed area. The first wall has a height greater than a height of the pellicle frame. The lid encases the pellicle membrane and pellicle frame within the recessed area with the seal making contact with the reticle on the first surface.

According to another aspect of the invention, the seal is an O-ring seal within a groove along the first edge for sealing the recessed area of the lid and the enclosed pellicle frame and pellicle membrane from an environment of the reticle.

According to another aspect of the invention, a method for cleaning a reticle without damaging or removing a pellicle membrane is performed. At one step, the pellicle is covered with a lid to separate the pellicle from an external environment of an uncovered portion of the reticle. At another step, a force is applied to the lid to seal the pellicle from the external environment. At another step, the reticle is secured to a base. At another step, fluid under pressure is ejected onto the uncovered portion of the reticle to clean the uncovered portion of foreign particles.

An advantage of the invention is that a reticle which does not accurately rest on a stepper table due to foreign particles is cleaned without removing or damaging the pellicle. An effect of this advantage is that the reticle does not need to go through an extensive process of re-applying a pellicle frame and pellicle membrane and requalifying the reticle for use in a lithographic process. These and other aspects and advantages of the invention will be better understood by reference to the following detailed description taken in conjunction with the accompanying drawings.

DESCRIPTION OF SPECIFIC EMBODIMENTS

Overview

Figure 1:
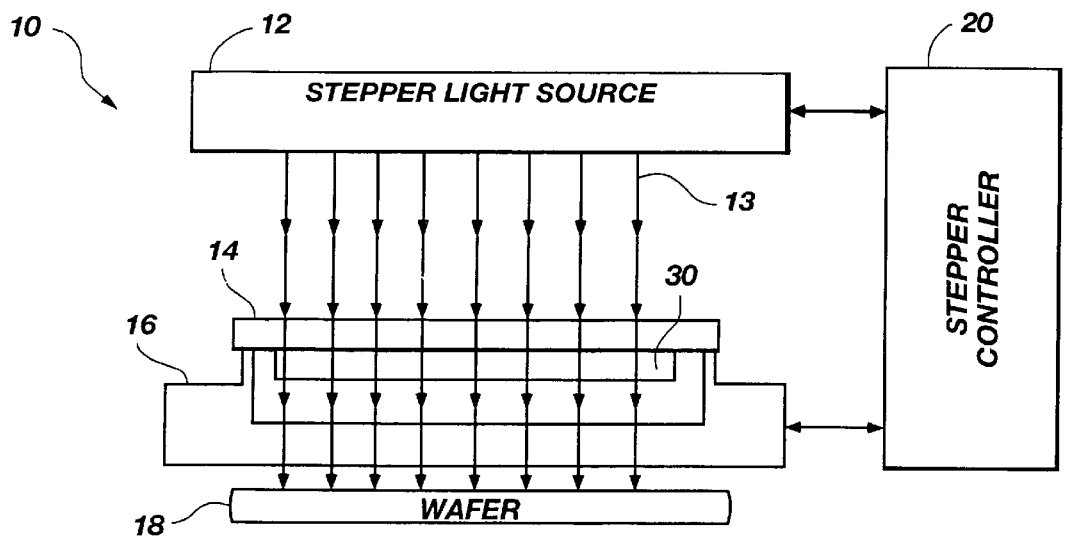
FIG. 1 is a block diagram of a conventional lithographic system with photomask and wafer.

FIG. 1 shows a block diagram of a conventional lithographic system 10. The lithographic system 10 includes a light source 12 which emits light 13 (e.g., ultraviolet light, visible light, infrared light). The light passes through a mask formed on a reticle 14, then through an opening in a reticle table 16, and onto a semiconductor wafer 18. A stepper controller 20 (also known as an aligner) controls the relative positioning of the light source 12 and reticle table 16. Typically, the light 13 serves to develop portions of photoresist applied to the wafer. The mask defines a pattern distinguishing which portions of the photoresist are developed and which are not developed.

Figure 2:
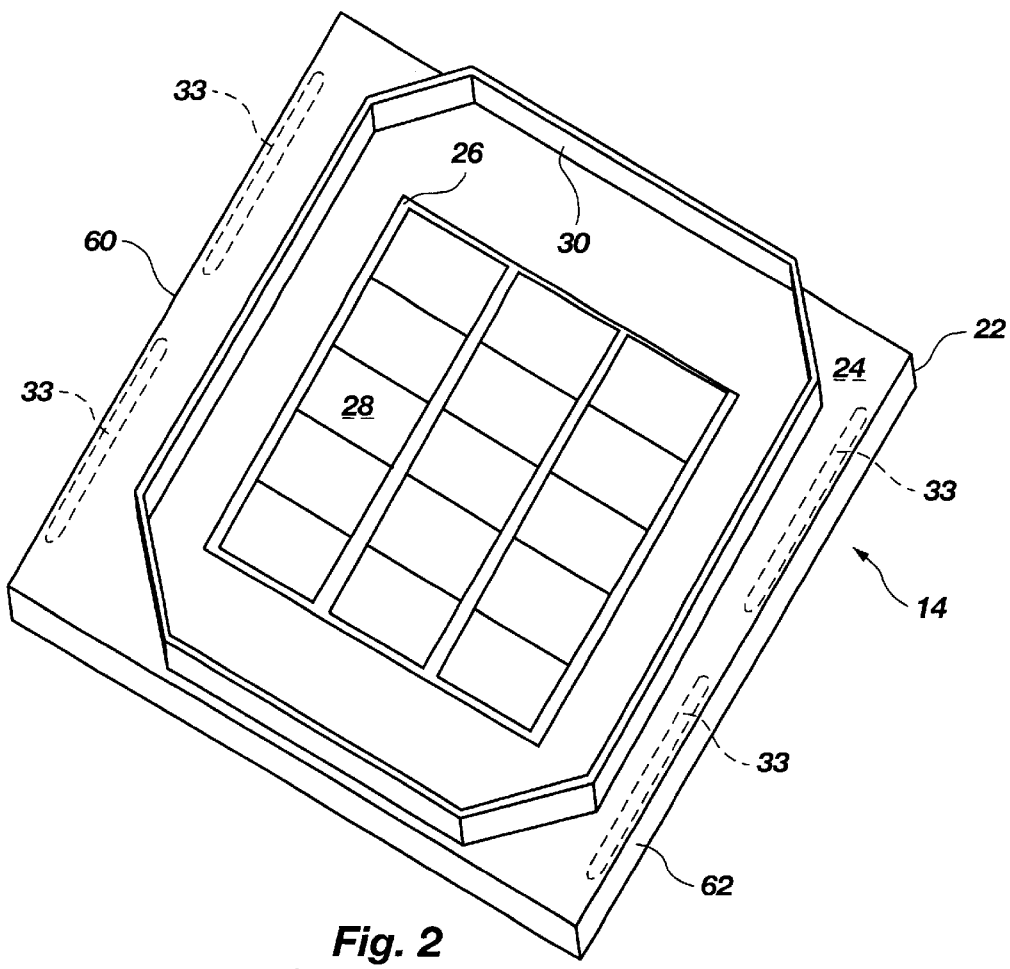
FIG. 2 is a perspective view of a conventional reticle with pellicle frame and pellicle membrane.
Figure 3:
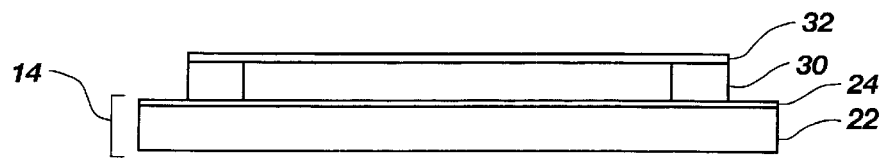
FIG. 3 is a side view of the reticle, pellicle frame and pellicle membrane of FIG. 2.

FIGS. 2 and 3 show a reticle 14. The reticle includes a transparent plate 22 or "blank" covered with a patterned film 24 of opaque material (i.e., the photomask). Although the size may vary, an exemplary reticle 14 is 6 inches by 6 inches and 0.25 inches thick. Conventional materials for the blank include soda lime, borosilicate glass or fused silica. The film of opaque material typically is a film of chrome less than 100 nm thick and covered with an anti-reflective coating such as chrome oxide. Within an area 26, the film 24 defines masks 28 for respective portions of the wafer 18. For example, in one embodiment illustrated, fifteen masks are shown. Each mask 28 within the area 26 may be the same or different, so as to make the same or different integrated circuits.

Attached to the reticle is a pellicle frame 30. In an exemplary embodiment, the pellicle frame 30 is adhered to the reticle 14 by double back tape. Other adhesive structures may be used, however. The pellicle frame 30 encloses the area 26 of the reticle having the masks 28. Adhered to the pellicle frame 30 is a thin membrane, referred to as a pellicle membrane 32. The pellicle membrane seals the area 26 from the external environment. As described in the background section, it is desirable to avoid foreign particles on a photomask. When a reticle with masks 28 is formed, the surface is cleaned and qualified to assure that the mask is accurate and that no foreign particles are present. As part of such qualification process, the pellicle membrane 32 is adhered to the pellicle frame 30. The pellicle membrane 32 protects the masks 28 from foreign particles. The pellicle membrane is formed of a conventional material such as cellulose acetate or nitrous cellulose.

As shown in FIG. 1, the reticle 14 rests on a reticle table 16 during the lithographic process. The lithographic processes often require that a given reticle 14 be replaced from the reticle table 16 with another reticle having a different mask pattern. This movement of reticles on and off the reticle table 16 can cause microscopic particles to adhere to the reticle 14. Further, reticles typically are stored in a carrying case. Microscopic particles also may adhere to the reticle from rubbing along rails of the reticle carrying case. If there are any foreign particles on the reticle in the regions 33 (see FIG. 2) where the reticle 14 is supposed to contact the reticle table 16, then the reticle may not be seated exactly. A portion of the reticle may be higher than another portion. This can result in bad registration of the light passing through a mask 28 onto a wafer, or in bad overlay from one mask to another mask. If such a problem is detected, the reticle is removed and cleaned. Because the pellicle membrane 32 typically is very fragile, the pellicle membrane is destroyed during the course of cleaning the reticle. Conventionally, the pellicle is removed and the entire surface of the reticle is cleaned. The pellicle frame and a pellicle membrane then are reapplied, and the structures 14, 30, 32 requalified for the desired lithographic operations.

Figure 4:
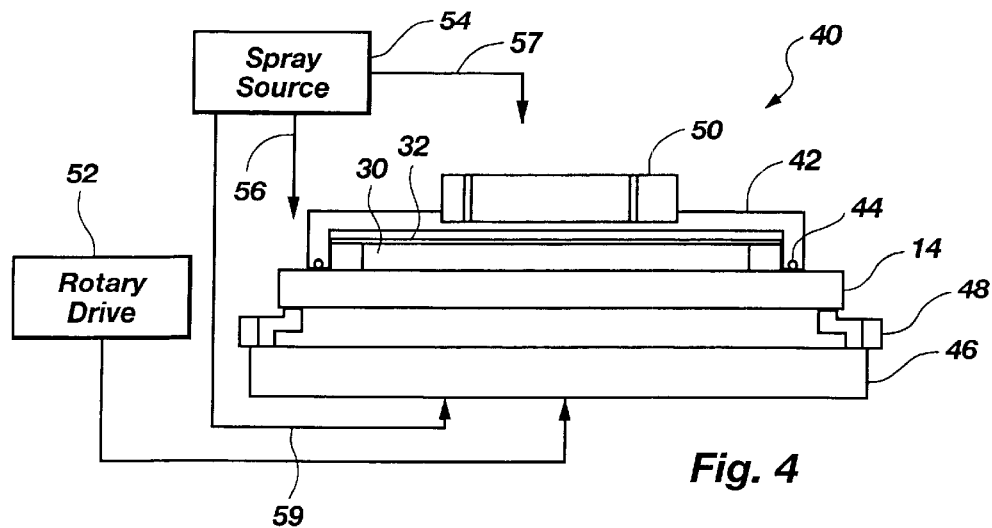
FIG. 4 is a diagram of a reticle cleaning system according to an embodiment of this invention.

FIG. 4 shows a cleaning system 40 according to an embodiment of this invention. During cleaning, the pellicle membrane 32 and pellicle frame 30 are covered to avoid damage. A lid 42 encases the pellicle membrane 32 and pellicle frame 30, sealing the pellicle from the external environment of the cleaning system. In one embodiment, an O-ring 44 defines the seal between the lid 42 and the reticle 14 adjacent to the pellicle frame 30. The O-ring 44 or seal is formed from silicon or another material.

During a cleaning operation, the reticle 14 is secured to a spin chuck 46. The spin chuck 46 includes reticle supports 48. The reticle 14 rests on the supports 48. An anchor plate 50 resides on top of the lid 42. The anchor plate 50 is bolted to the spin chuck 46, pressing the lid 42 to the reticle 14 to maintain the seal, and pressing the reticle to the reticle supports 48. Thus, the reticle 14 and lid 42 are sandwiched between the anchor plate 50 and spin chuck 46.

With the lid 42 and reticle 14 secure, a rotary drive 52 rotates the spin chuck 46. In addition, a spray source 54 ejects a fluid to clean and rinse the reticle 14. In one embodiment, de-ionized water or another fluid is ejected as a fan spray 57 to the upper surface of the anchor plate 50, reticle 14 and spin chuck 46 assembly and as a rinse spray 59 to a lower surface of such assembly. Then a fluid under pressure (e.g., 500 psi) is ejected as a high pressure spray 56 onto at least the exposed portions of the reticle 14 to clean away any foreign particles on the reticle 14. The fluid ejected from the fan spray and rinse spray is de-ionized water in one embodiment, although other liquid or gas fluids may be used. The fluid ejected from the high pressure spray 56 is ammonium hydroxide, de-ionized water and/or another liquid or gas fluid. In one method for cleaning the reticle, the spin chuck 46 rotates at 1500 revolutions per minute during the ejection of the fluids. The high pressure spray 56 then ceases, followed by cessation of the fan spray 57 and rinse spray 59. The spin chuck 46 then increases the rotational rate (e.g., to 2000 rpm) during a drying time period. The speeds of revolution, the pressure of the fluids emitted from sprays 56, 57 and 59 and the time for spraying and drying the assembly may vary.

The reticle 14, being secured to the spin chuck 46, rotates with the spin chuck 46. Rotation of the reticle 14 places different exposed portions of the reticle 14 in the path of the high pressure fluid spray 56. In a preferred embodiment, the portion of the reticle 14 which is in contact with the reticle table 16 during a lithographic process is exposed during the cleaning process. Specifically, such portion is not covered by the lid 42.

Figure 5:
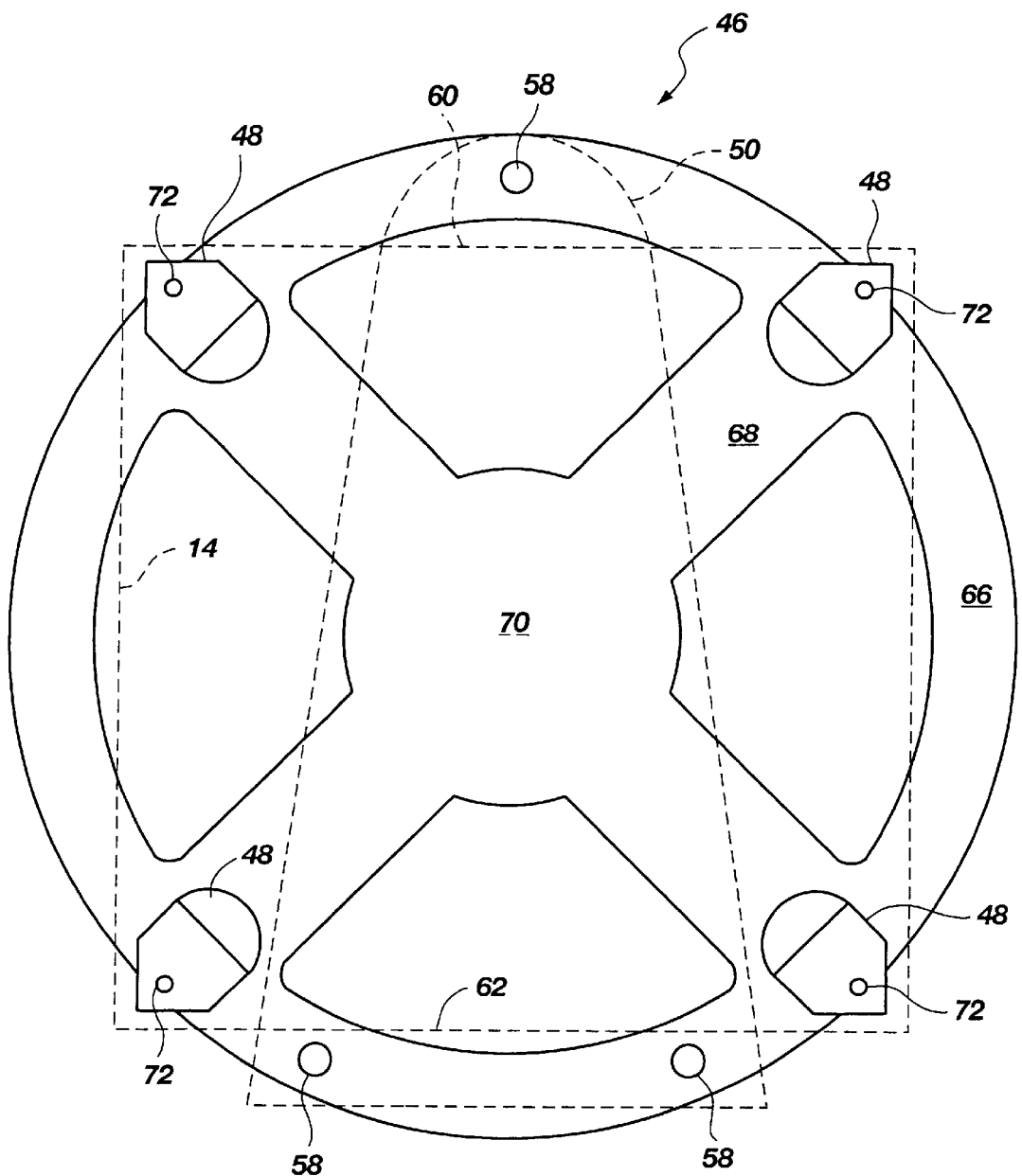
FIG. 5 is a plan view of a spin chuck of FIG. 4 according to an embodiment of this invention.

FIG. 5 shows a spin chuck 46 according to an embodiment of this invention. The spin chuck 46 serves as a base to which the other components are secured. The base 46, either with or without the reticle supports 48, serves as a support for the reticle 14 (e.g., in one embodiment, supports are integral to the base). In one embodiment, the spin chuck 46 is of sufficient area that a portion of the spin chuck 46 is exposed when the reticle 14 is secured to the spin chuck. Openings 58 occur in the exposed areas along opposite edges 60, 62 of the reticle 14. Such openings receive pins 64 (see FIG. 8) which secure the anchor plate 50 to the spin chuck 46.

In various embodiments, the spin chuck 46 has different shapes (e.g., circular, square, rectangular, or other shape). In the embodiment illustrated, the spin chuck is a ring 66 with spokes 68 extending from a central portion 70. Multiple reticle supports 48 are attached to the spin chuck 46. In one embodiment, the reticle supports 48 are bolted to the spin chuck 46. In another embodiment, the supports 48 are integral to the rest of the spin chuck 46. Each reticle support has a distal surface or pin 72 upon which the reticle 14 rests during cleaning. The spin chuck 46 is rotated by the rotary drive 52.

Figure 6:
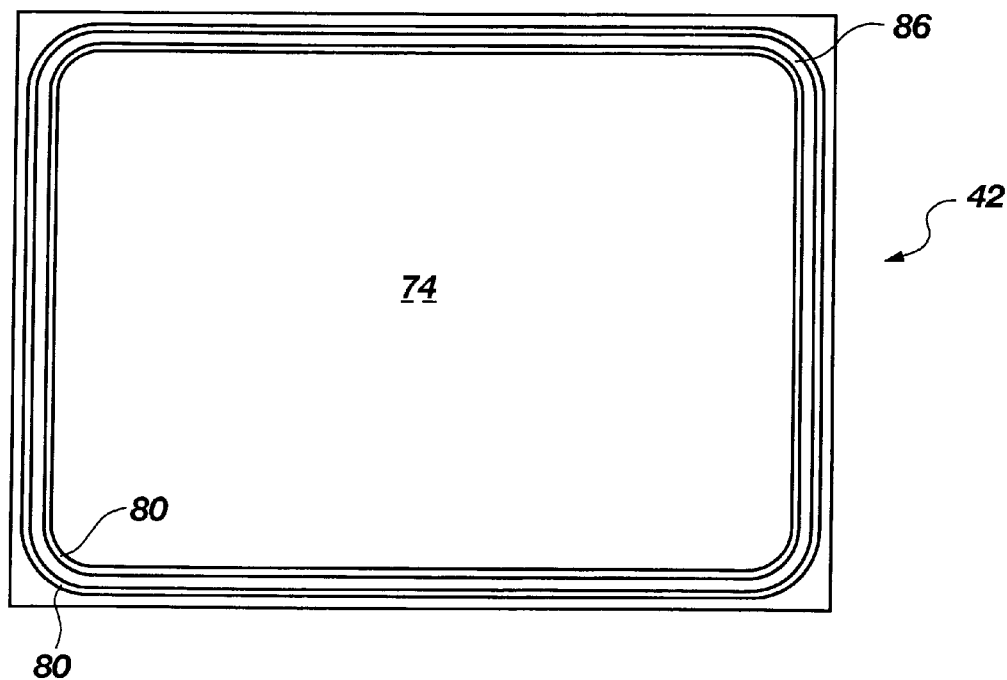
FIG. 6 is a plan view of a pellicle cover of FIG. 4 according to an embodiment of this invention.
Figure 7:
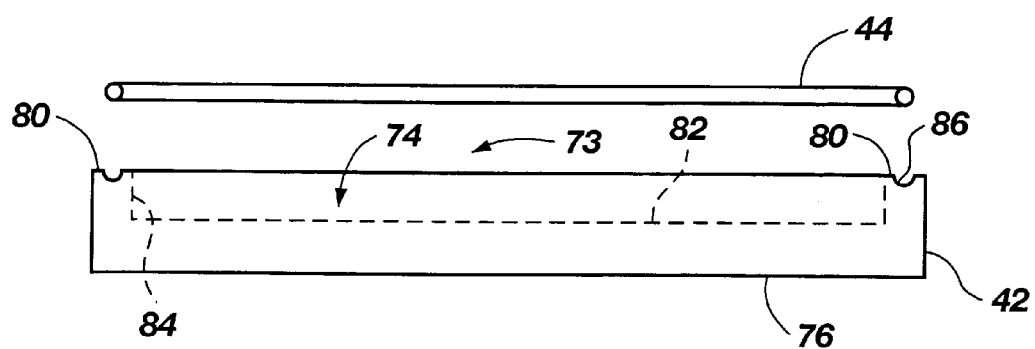
FIG. 7 is a side view of the pellicle cover of FIG. 6, along with a side view of an O-ring.

FIGS. 6 and 7 show the lid 42 for covering the pellicle frame 30 and pellicle membrane 32. The lid is generally planar, defining two faces 73, 76. One face 76 defines a generally planar exterior surface. The contour of the exterior surface 76, however, need not be planar and may vary. The other face 73 defines a distal surface 80 and a recessed area 74. The recessed area is delimited by an interior surface 82 and a wall 84 and a distal surface 80. The wall 84 extends from the interior surface 82 to the distal surface 80. When the lid 42 is applied over the pellicle onto the reticle 14, the pellicle frame 30 and pellicle membrane 32 are enclosed within the recessed area 74. Accordingly, the height of the wall 84 relative to the interior surface 82 is greater than a height of the pellicle frame 30. The lid 42 includes a seal along the distal surface 80. In one embodiment, the seal is formed by a groove 86 and an O-ring 44. In an exemplary embodiment, the groove is 0.07 inches wide with a depth of 0.04 inches. The distal surface 80 spans a width of 0.2 inches. Such dimensions, however, vary for differing embodiments. The O-ring 44 seats within the groove 86 and extends along the entire circumference of the distal wall 80 so as to form a seal all the way around the pellicle frame 30. In other embodiments, an alternative sealing device is used, such as a gasket. Preferably, the seal and lid 42 are formed of material which does not readily chip. The advantage of such material is the avoidance of leaving foreign particles on the reticle 14 when the lid 42 is removed from the reticle 14. When the lid 42 is applied to the reticle 14, the pellicle frame 30 and pellicle membrane 32 are completely encased between the lid 42 and reticle 14. When the lid 42 is pressed to the reticle 14, the seal isolates the pellicle membrane 32 from the environment of the cleaning system 40, and in particular from the ejected fluid. As the ejected fluid would break the pellicle membrane 32, the lid 42 prevents the pellicle membrane 32 from being damaged during the cleaning process.

Figure 8:
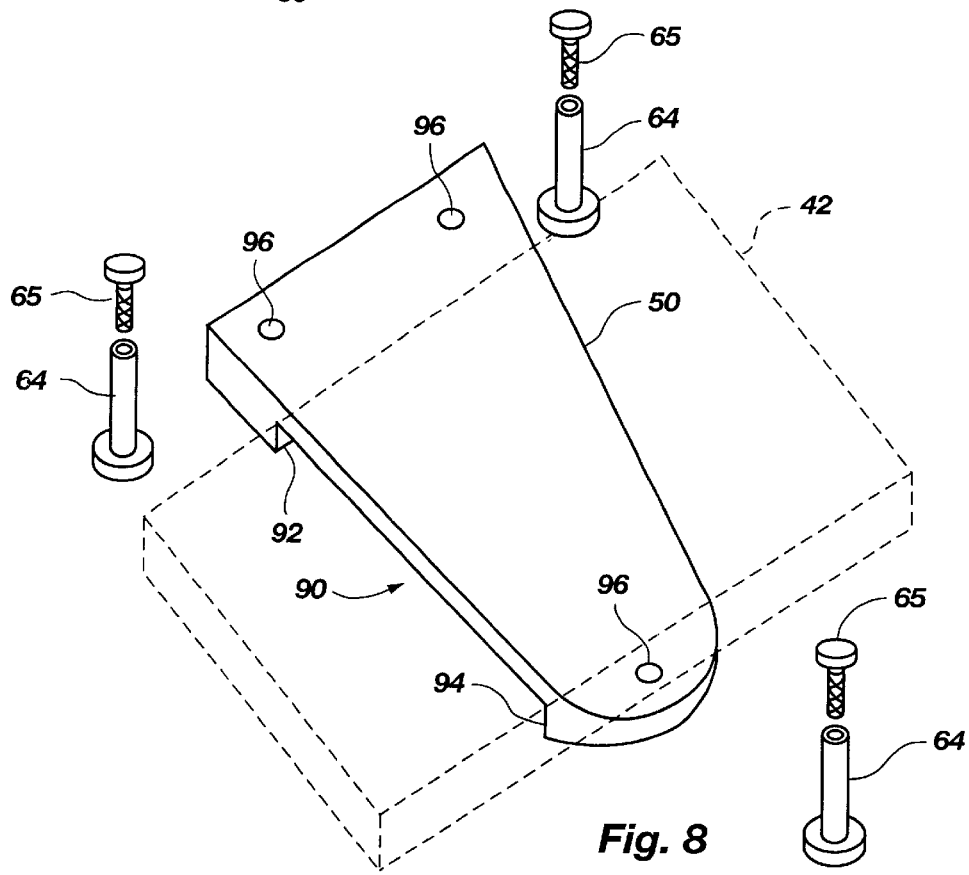
FIG. 8 is a perspective view of an anchor cap of FIG. 4 according to an embodiment of this invention.

FIG. 8 shows the anchor plate 50 which clamps the lid 42 to the reticle 14 and holds the reticle 14 to the spin chuck 46. The anchor plate 50 includes a recessed area 90 bordered by two opposing walls 92, 94. In the embodiment illustrated, the recessed area 90 is not enclosed. The anchor plate 50 fits over the lid 42 with the lid 42 fitting between the walls 92, 94 of the recessed area 90. In one embodiment, the lid 42 is mounted to the anchor plate 50 with screws. The walls 92, 94 fix the orientation of the lid 42 relative to the reticle 14, so as to prevent movement, displacement or offset of the lid 42 by the ejected fluid during cleaning. The anchor plate 50 defines openings 96 which receive the pins 64. The pins 64 pass through the openings 58 in the spin chuck 46 (see FIG. 5). In one embodiment, a respective screw 65 extends into a threaded opening of each pin 64. The screw 65 pushes the anchor plate 50 toward the spin chuck 46. In alternative embodiments, the pins are integral to either the anchor plate 50 or spin chuck 46. In another embodiment, an alternative clamp (e.g., C-clamp; nut and bolt) is used to secure the anchor plate 50 to the spin chuck 46.

Meritorious and Advantageous Effects

An advantage of the invention is that a reticle which does not accurately rest on a stepper table due to foreign particles is cleaned without removing or damaging the pellicle membrane. An effect of this advantage is that the reticle does not need to go through an extensive process of re-applying a pellicle frame and pellicle membrane and requalifying the reticle for use in a lithographic process. Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A system for cleaning a reticle without damaging or removing a pellicle membrane of the reticle, the system comprising:
 a support configured to hold a reticle that includes a pattern on a first surface thereof;
 a lid disposable in contact with said first surface so as to enclose and seal a pellicle membrane disposed over said pattern and spaced apart therefrom by a pellicle frame;
 a sealing element for securing said lid to a reticle;
 a fluid source; and
 a fluid ejector in communication with said fluid source and by which fluid can be directed onto an area of the reticle not covered and sealed by said lid.

2. The system of claim 1, wherein at least a portion of a second surface of the reticle opposite said pattern is exposed.

3. The system of claim 1, further comprising a securing member configured to bias said lid against said first surface.

4. The system of claim 1, further comprising a rotation component associated with said support and configured to change a position of said reticle exposed to said fluid source.

5. The system of claim 1, wherein said lid includes a sealing member disposed adjacent a peripheral edge thereof.

6. The system of claim 5, wherein said sealing member is disposed at least partially within a groove defined in said peripheral edge.

7. The system of claim 6, wherein said sealing member protrudes from said peripheral edge.

8. The system of claim 5, wherein said sealing member comprises an O-ring.

9. The system of claim 5, wherein said sealing member is configured to contact said reticle upon disposal of said lid over said pellicle membrane.

10. The system of claim 1, wherein said support comprises a base and at least one elevated edge configured to contact said reticle.

11. The system of claim 3, wherein said securing member is securable to said support.

12. The system of claim 3, wherein said securing member comprises a clamp.

13. The system of claim 1, wherein said fluid source is configured to spray fluid.

14. A method for cleaning a reticle, comprising:
 covering and sealing a pellicle membrane disposed over a patterned region of the reticle from a cleaning medium; and
 directing a quantity of the cleaning medium into contact with an uncovered region of the reticle.

15. The method of claim 14, wherein said covering and sealing comprises disposing a lid over at least said patterned region.

16. The method of claim 15, wherein said disposing said lid comprises sealing said lid against the reticle.

17. The method of claim 14, further comprising directing said cleaning medium toward another unshielded region of the reticle.

18. The method of claim 17, wherein said directing said cleaning medium toward another unshielded region of the reticle comprises rotating the reticle.

19. A method for cleaning a reticle without damaging or removing a pellicle membrane disposed over a first surface of the reticle, comprising:
 covering and sealing said pellicle membrane; and
 directing a quantity of fluid into contact with a region of the reticle not covered and sealed.

20. The method of claim 19, wherein said covering and sealing comprises biasing a lid against said first surface of the reticle.

21. The method of claim 19, wherein said directing said quantity of fluid comprises directing pressurized fluid.

22. The method of claim 19, wherein said directing said quantity of fluid comprises removing foreign particles from at least one exposed region of the reticle not shielded.

23. The method of claim 19, wherein said directing said quantity of fluid comprises directing said quantity of fluid toward a second surface of the reticle, opposite the first surface.

24. The method of claim 19, further comprising rotating at least one of the reticle and a fluid source relative to one another.

* * * * *

UNITED STATES PATENT AND TRADEMARK OFFICE
CERTIFICATE OF CORRECTION

PATENT NO.     : 6,458,216 B1
DATED          : October 1, 2002
INVENTOR(S)    : Matthew E. Williams It is certified that error appears in the above-identified patent and that said Letters Patent is hereby corrected as shown below:

Column 5,
Line 47, change "base" to -- spin chuck --

Column 6,
Line 21, change "wall" to -- surface --

Signed and Sealed this

Eighth Day of April, 2003

JAMES E. ROGAN
*Director of the United States Patent and Trademark Office*